(12) United States Patent
Varadarajan et al.

(10) Patent No.: US 9,143,167 B2
(45) Date of Patent: Sep. 22, 2015

(54) RATE MATCHING AND SCRAMBLING TECHNIQUES FOR CONTROL SIGNALING

(71) Applicant: TEXAS INSTRUMENTS INCORPORATED, Dallas, TX (US)

(72) Inventors: Badri N. Varadarajan, Mountain View, CA (US); Xiaomeng Shi, West Roxbury, MA (US); Eko Nugroho Onggosanusi, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/194,430

(22) Filed: Feb. 28, 2014

(65) Prior Publication Data

US 2014/0195880 A1    Jul. 10, 2014

Related U.S. Application Data

(62) Division of application No. 12/170,416, filed on Jul. 9, 2008, now Pat. No. 8,683,305.

(60) Provisional application No. 60/948,370, filed on Jul. 6, 2007.

(51) Int. Cl.
*H03M 13/00* (2006.01)
*H03M 13/11* (2006.01)
*H04L 1/00* (2006.01)
*H04L 27/26* (2006.01)

(52) U.S. Cl.
CPC ......... *H03M 13/1111* (2013.01); *H04L 1/0067* (2013.01); *H04L 1/0072* (2013.01); *H04L 1/0013* (2013.01); *H04L 1/0046* (2013.01); *H04L 1/0065* (2013.01); *H04L 27/2626* (2013.01)

(58) Field of Classification Search
None
See application file for complete search history.

(56) References Cited

U.S. PATENT DOCUMENTS

| 7,158,635 | B2* | 1/2007 | Dick et al. | 380/28 |
| 7,543,197 | B2* | 6/2009 | Palanki et al. | 714/701 |
| 2005/0135517 | A1 | 6/2005 | Coffey et al. | |
| 2005/0243774 | A1* | 11/2005 | Choi et al. | 370/335 |
| 2007/0047513 | A1* | 3/2007 | Anderson | 370/345 |
| 2007/0237266 | A1* | 10/2007 | Reial et al. | 375/341 |
| 2008/0151976 | A1 | 6/2008 | Stoye | |
| 2008/0212694 | A1* | 9/2008 | Leach et al. | 375/260 |
| 2009/0067424 | A1* | 3/2009 | Zhang et al. | 370/389 |

* cited by examiner

*Primary Examiner* — M. Mujtaba K Chaudry
(74) *Attorney, Agent, or Firm* — Ronald O. Neerings; Frank D. Cimino (57) ABSTRACT

Embodiments of the present disclosure provide a transmitter, a receiver and methods of operating a transmitter and a receiver. In one embodiment, the transmitter includes an input padding module configured to provide padded bits having padding bits added to payload bits for one or more control channels, and a scrambling module configured to apply a masking sequence to one or more of the padded bits to generate scrambled bits. Additionally, the transmitter also includes an encoding module configured to perform forward error correction encoding and rate matching on the scrambled bits to obtain a required number of control channel output bits, and a transmit module configured to transmit the control channel output bits for one or more control channels.

24 Claims, 8 Drawing Sheets

RATE MATCHING AND SCRAMBLING TECHNIQUES FOR CONTROL SIGNALING

CROSS-REFERENCE TO PROVISIONAL APPLICATIONS

This application is a Divisional of application Ser. No. 12/170,416 filed Jul. 9, 2008 which claims the benefit of U.S. Provisional Application No. 60/955,796 entitled "CRC Scrambling Methods for UE Identification In DL Control Channel Decoding" to Badri N. Varadarajan and Xiaomeng Shi filed on Aug. 14, 2007, which is incorporated herein by reference in its entirety.

TECHNICAL FIELD

The present disclosure is directed, in general, to a communication system and, more specifically, to a transmitter, a receiver and methods of operating a transmitter and a receiver.

BACKGROUND

In a cellular network, such as one employing Orthogonal Frequency Division Multiple Access (OFDMA), each cell employs a base station that communicates with user equipment, such as a cell phone, a laptop, or a PDA, that is actively located within its cell. Typically, the available downlink transmission resources are shared among multiple users, wherein each user gets scheduled on some time-frequency resources. Further, each scheduled user also might get data with different modulation & coding scheme, retransmission number and other transmission parameters. To enable the user equipment to determine the resources on which it is scheduled (if any) and the corresponding transmission parameters, the base station employs downlink control signaling. The design of control signaling should minimize the necessary overhead, while also ensuring that user elements in the cell can accurately and efficiently decode the control signal. Improvements in control channel signaling would prove beneficial in the art.

SUMMARY

Embodiments of the present disclosure provide a transmitter, a receiver and methods of operating a transmitter and a receiver. In one embodiment, the transmitter includes an input padding module configured to provide padded bits having padding bits added to payload bits for one or more control channels, and a scrambling module configured to apply a masking sequence to one or more of the padded bits to generate scrambled bits. Additionally, the transmitter also includes an encoding module configured to perform forward error correction encoding and rate matching on the scrambled bits to obtain a required number of control channel output bits, and a transmit module configured to transmit the control channel output bits for one or more control channels.

In one embodiment, the receiver includes a control signal receiving module configured to extract soft information on received control signal bits for one or more control channels, and a rate de-matching and forward error correction decoding module configured to process the soft information to obtain a set of decoded bits. Additionally, the receiver also includes a descrambling module configured to apply a masking sequence to one or more of the decoded bits to provide a set of unmasked bits, and a payload extraction and padding-check module configured to test validity of at least one of the payload bits and padding bits from the unmasked bits.

In another aspect, the present disclosure provides a method of operating a transmitter. The method includes providing padded bits having padding bits added to payload bits for one or more control channels and applying a masking sequence to one or more of the padded bits to generate scrambled bits. The method also includes performing forward error correction and rate matching on the scrambled bits to obtain a required number of control channel output bits and transmitting the control channel output bits for one or more control channels.

In yet another aspect, the present disclosure provides a method of operating a receiver. The method includes extracting soft information on received control signal bits for one or more control channels and processing the soft information for the control channel to obtain a set of decoded bits. The method also includes applying a masking sequence to one or more of the decoded bits to provide a set of unmasked bits and testing validity of at least one of the payload bits and padding bits from the unmasked bits employing a padding-check module.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Figure 1A:
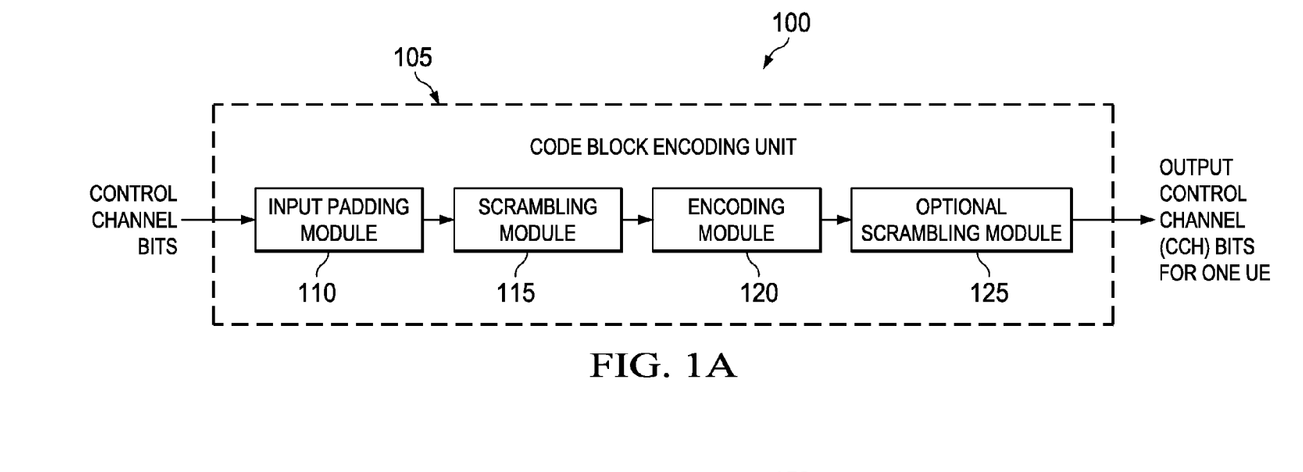
FIG. 1A illustrates a diagram of an embodiment of a code block encoding unit constructed according to the principles of the present disclosure

FIG. 1A illustrates a diagram of an embodiment of a code block encoding unit 100 constructed according to the principles of the present disclosure. The code block encoding unit 100 includes an input padding module 110, a scrambling module 115, an encoding module 120 and an optional scrambling module 125.

In the illustrated embodiment, the input padding module 110 is configured to provide padded bits wherein padding bits are added to payload bits for one or more control channels. The scrambling module 115 is configured to apply a masking sequence to one or more of the padded bits to generate scrambled bits. The encoding 120 is configured to perform forward error correction and rate matching on the scrambled bits to obtain a required number of control channel output bits. These control channel output bits may optionally be further scrambled by the additional scrambling module 125.

Figure 1B:
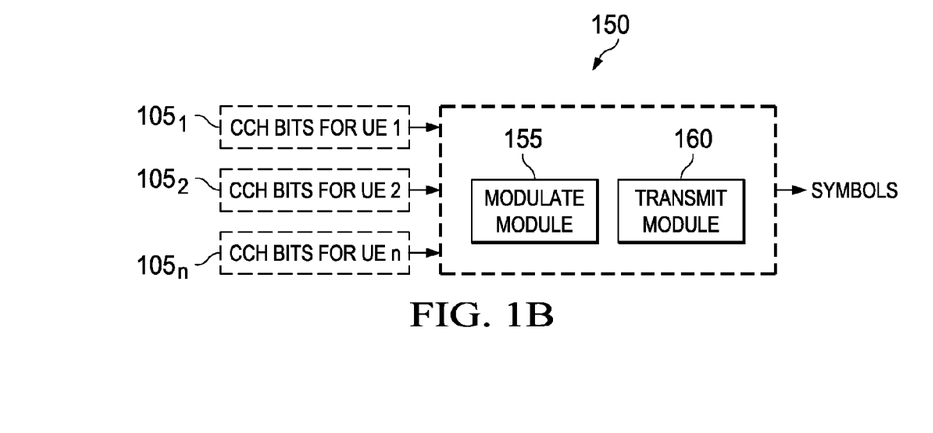
FIG. 1B illustrates a diagram of an embodiment of a transmitter constructed according to the principles of the present disclosure.

FIG. 1B illustrates a diagram of an embodiment of a transmitter 150 constructed according to the principles of the present disclosure. In the illustrated embodiment, the transmitter 150 includes a group of code block encoding units ($105_1$-$105n$), a modulate module 155 and a transmit module 160. The group of code block encoding units ($105_1$-$105n$) provides a group of output control channel bits for a corresponding group of user equipment, as discussed above. The modulate module 155 modulates the group of output control bits for transmission, and the transmit module 160 transmits the group of modulated control channel output bits.

With continued reference to FIGS. 1A and 1B, the code block encoding unit 100 provides a transmission structure for a single control channel. In each subframe, control signals may be transmitted to n different UEs in a communication cell. This involves a two-step process. First, a payload containing control signaling bits is independently encoded for each control channel, where each control channel corresponds to one UE or a set of UEs addressed by a common identification number. Then, the encoded bits for different control channels are combined, modulated and processed for actual on-air transmission.

A cycle redundancy check (CRC) calculation is performed on a control channel payload in the padding module 110. After the CRC is inserted, a scrambling or masking is done on the bits in the scrambling module 115. A unique scrambling code or mask is used for each identification number, which may refer to an individual UE or a group of UEs.

Note that if a UE uses a wrong Identification number while descrambling, the CRC will not pass. Thus, employing an identification number masking specific to the UE enables each scheduled UE (or group of UEs) to extract its correct control channel where even multiple control channels are combined. After CRC insertion and scrambling, the bits are encoded by the forward error correction encoder in the encoding module 120. The encoded bits are then rate-matched in the encoding module 120 so that the number of coded output bits used fits the desired control channel output size. The output bits may again be scrambled in the optional scrambling module 125, if scrambling is not done before the FEC input.

Figure 2:
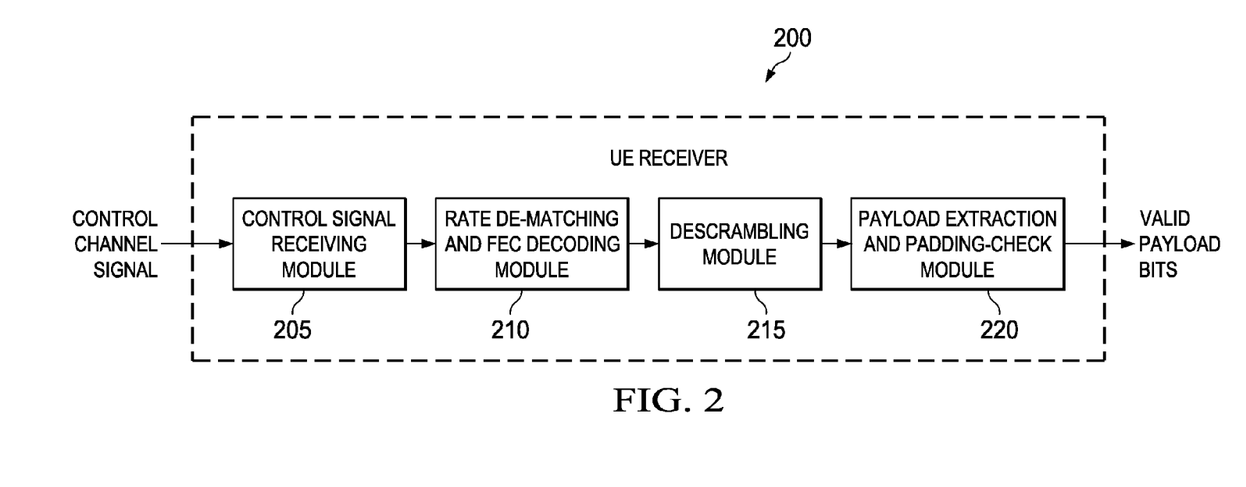
FIG. 2 illustrates a diagram of an embodiment of a receiver constructed according to the principles of the present disclosure.

FIG. 2 illustrates a diagram of an embodiment of a receiver 200 constructed according to the principles of the present disclosure. The receiver 200 includes a control signal receiving module 205, a rate de-matching and forward error correction decoding module 210, a descrambling module 215 and a payload extraction and padding-check module 220. In the illustrated embodiment, the control signal receiving module 205 is configured to extract soft information on received control signal bits for one or more control channels. The rate de-matching and forward error correction decoding module 210 is configured to process the soft information to obtain decoded bits. Additionally, the descrambling module 215 is configured to apply a masking sequence to one or more of the decoded bits to provide a set of unmasked bits, and the payload extraction and padding-check module 220 is configured to test validity of at least one of the payload bits and padding bits from the unmasked bits.

In the illustrated embodiment, the receiver 200 is for use with a UE wherein received control channel bits are first combined to form a single stream, which is then modulated to, say QPSK transmission, and put in time-frequency resource elements allocated for control signaling. (Other time-frequency elements may be taken up for data transmission, reference signals, etc.)

It is instructive to understand how a given UE decodes the control signal from the Node B. The UE obtains the entire control signal transmitted by the Node B. However, it does not know whether (i) there is a control channel assigned to itself, and (ii) the size and location of the control channel, if it is assigned. To resolve this, the UE tries various candidate control channels of different sizes and locations.

For each candidate, the UE decodes the received data and descrambles (or unmasks) as appropriate. It then examines the CRC to see if it passes. As described earlier, the CRC is expected to pass with a high probability, when the UE decodes its own control channel. On the other hand, if the UE attempts to decode an invalid control channel (or a valid control channel meant for another UE), the CRC is likely to fail. Indeed, it is easy to show that the probability when the CRC passes for a wrong candidate decreases exponentially with the CRC length.

If the CRC for a candidate passes, the UE adds the current control channel to the list of possibly valid control channels. It then proceeds to the next candidate, if any. When all candidates are exhausted, the UE outputs the list of valid control channels for further processing.

The present disclosure focuses on two crucial facts about the procedure. First, to limit the computational burden of the UE, it is essential to reduce the number of candidate control channels for a given size of the total control signal. Second, to limit the number of false CRC passes, it is essential to choose a sufficiently large CRC length and to design the scrambling or masking procedure to differentiate different UE identification numbers. Embodiments of the present disclosure, address both aspects.

In the first part, techniques are addressed to limit the number of candidate control channels. Given the total control signal, the UE obtains the control channel candidates by using the known set of possible control channel sizes and start locations. Suppose there are four control channels whose sizes (in terms of output bits) are N, 2N, 3N and 4N bits. Then, given a total control signal of size mill, one may consider integer partitions of the total control signal into multiples of N to generate candidate control channels.

Some further constraints may be used in limiting the number of candidates. For instance, it may be known that the start position of a control channel size of 1N is required to be a multiple of 1N. (This constraint is placed, for example, in 3GPP LTE.) Further, for a given output size of the control channel, there may also be multiple input sizes to the FEC encoder. Recall that the FEC input is the result of appending CRC to the input bits and some possible scrambling or masking. For each possible input size, a separate FEC decode is required, increasing the computational burden.

From the above discussion, it is clear that the total number of decoding attempts by the UE depends on: (i) the number of possible control channel output sizes, (ii) the number of possible start locations, and (iii) the number of FEC input sizes for a given output size. Of these, the first two factor are controlled, respectively, by the code rates to be supported (to ensure that all users in the cell edge can be reached), and the number of UEs to scheduled simultaneously. Embodiments of this disclosure provide a means of limiting the third factor above, as described below.

Figure 3:
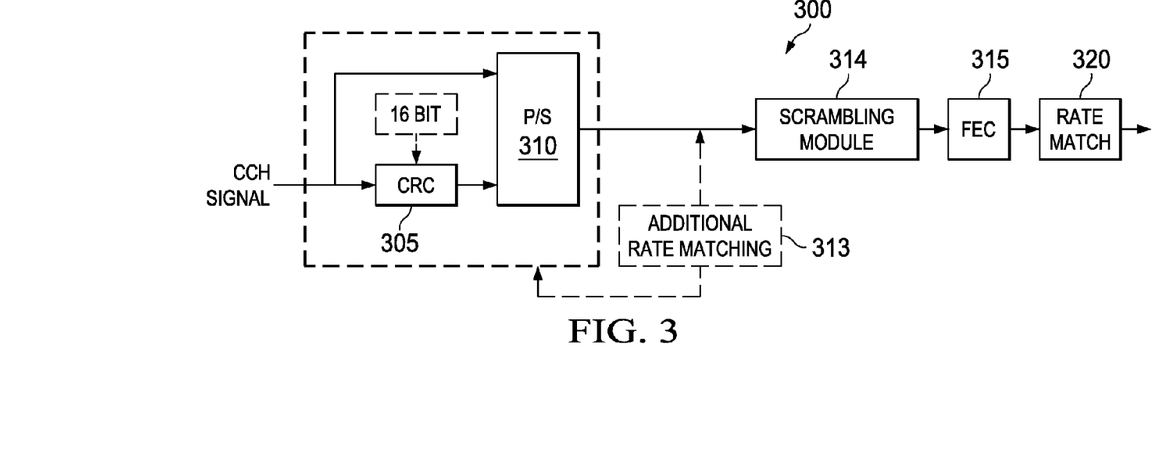
FIG. 3 illustrates the block diagram of an embodiment of a control channel transmitter constructed according to the principles of the present disclosure.

To limit the number of FEC decodes, embodiments of the disclosure add input rate-matching so that the number of FEC input bits for two control channels is the same, even if their payload lengths are slightly different. FIG. 3 illustrates the block diagram of an embodiment of a control channel transmitter 300 constructed according to the principles of the present disclosure. In the current art, the CRC module 305 computes the CRC on the payload bits, which is then appended to the payload bits by the module 310 to yield padded bits. These padded bits are then fed to the scrambling module (314), FEC encoded and rate-matched (modules 315 and 320) to yield control channel output bits.

Consider, for example, the case where two different transport block sizes are close may be considered, say 16 bits and 18 bits. In the current art, a CRC of fixed length, say 16 bits, is appended to either transport block, giving FEC inputs of length 32 and 34 bits respectively. Even if the FEC output length for both control channels is the same, two different decodes are required to test both possible hypotheses for the transport block size. The FEC input sizes are made equal by adding additional rate matching either before or after CRC insertion. Thus, as illustrated in FIG. 3, module 313 may be added to ensure that the number of padded bits being fed to the scrambling module (314) is constant. In the example discussed above, the rate matching module may, for example, add two additional padding bits to the smaller payload length, to ensure that both control channels have a total of 34 padded bits input to the scrambling module 314. This additional rate matching can be done in the following exemplary ways.

Figure 4A:
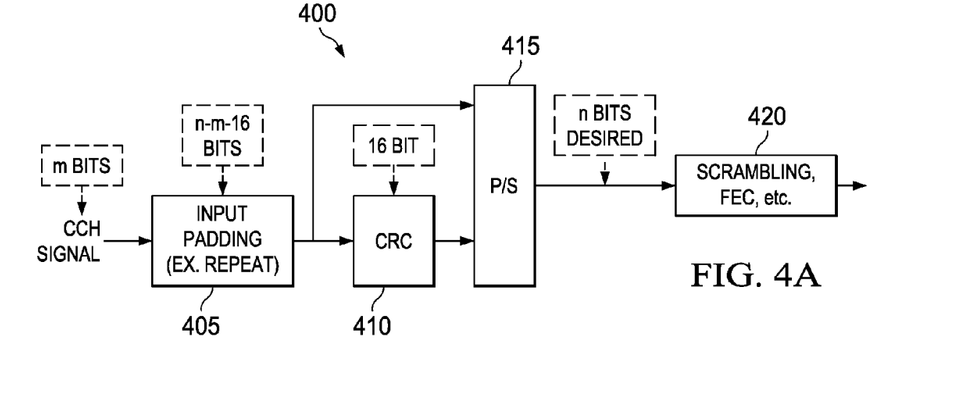
FIGS. 4A, 4B, 4C and 4D illustrate block diagrams of embodiments of transmission techniques that provide additional rate matching.

FIGS. 4A, 4B, 4C and 4D illustrate block diagrams of embodiments of transmission techniques that provide additional rate matching. Optional padding can be added to the smaller transport block size to make it equal to the larger transport block size. This is shown in FIG. 4A, where the padding module 405 adds some pad bits to the payload. The CRC is then calculated (by module 410) on the combination of the payload and preliminary pad bits. The number of pad bits added by module 405, namely n-m-16, ensures that the number of bits output by module 410 is n, even for two different values m1 and m2 of the payload length.

Focusing on the first padding module, the padding bits may consist of fixed values (say all zero, or all one bits), or it may be dependent on the input. In one exemplary embodiment, a linear code is used to obtain the pad bits given the input bits. For example, the code may be a repetition code, which repeats some n-m-16 bits in a payload of length m bits.

Figure 4B:
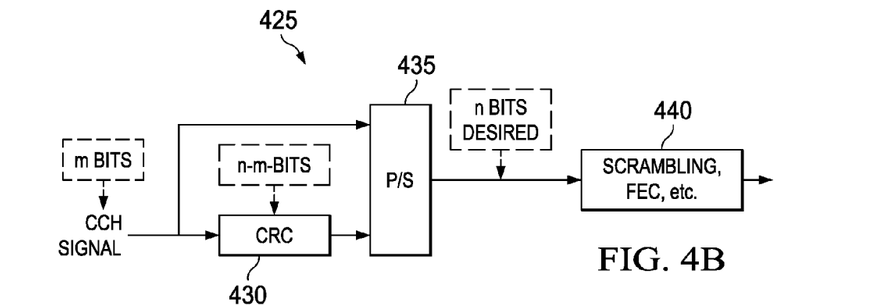

The CRC length can be increased for the smaller transport block sizes to make the total of transport block and CRC sizes equal for both cases. This is illustrated in FIG. 4B, wherein the CRC computation module 430 produces n-m bits. Thus, if two different payload lengths m1 and m2 are used, the module 430 pads different numbers of CRC bits to ensure that the total number of output bits from module 430 is n for both payloads.

Figure 4C:
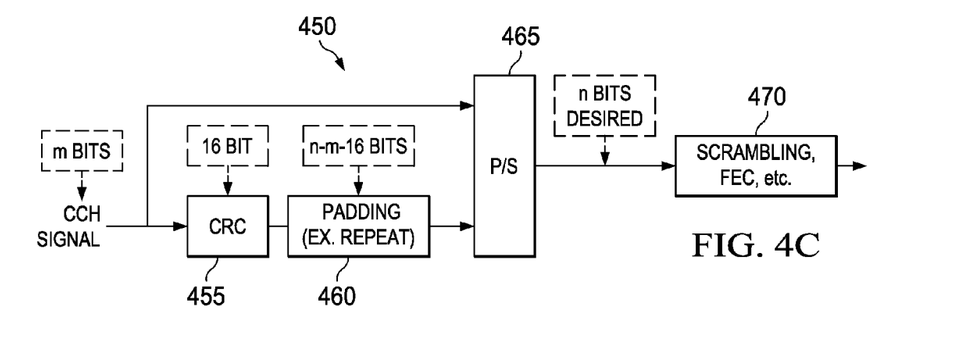

Padding can be added to the CRC bits instead of the input bits, as shown in FIG. 4C. Here, the CRC module 455 always produces the same number of CRC bits. However, a padding module 460 now adds pad bits computed from the CRC bits. Again, the padding bits can be done by some linear code, of which the repetition code is only an example. These total pad bits are then combined with the payload (465) to yield the desired bits for further processing.

Figure 4D:
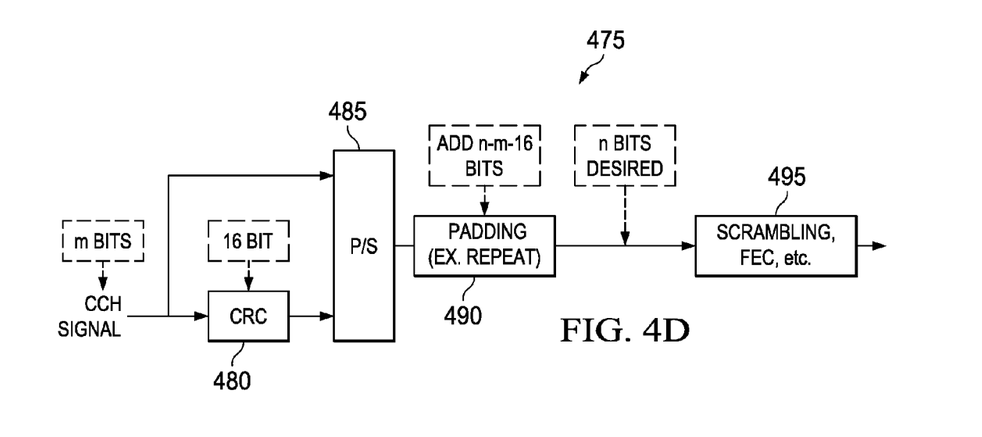

Additional padding can be performed after CRC insertion, as illustrated in FIG. 4D. After CRC calculation (module 480) and insertion (485), a linear code produces additional padding bits which are appended to the input of module 485 to produce the desired bits for further processing (495). By varying the number of padding bits depending on the payload length, the number of bits output by module 490 can be the same for two different payload lengths. Of course, other embodiments which modify padding and CRC insertion depending on the input size are possible under the principles of the present disclosure.

In the second part, improving the accuracy of UE decoding is considered. As mentioned earlier, the UE determines the correctness of each hypothesis using the CRC check. To ensure that a UE (or UE group) will not use control channels transmitted to other UEs (or UE groups), a scrambling mask that is unique to the control channel is employed. Typically, the control channel identification number is the same as the identification number of the UE (or UE group) to which the control channel is transmitted.

Masks chosen for different control channels are such that the CRC passes only when the correct mask is applied. This can be achieved in multiple ways. For example, in the 3GPP LTE standard, each control channel has a 16-bit identification number. Since the CRC also has 16 bits, scrambling is achieved by a bit-wise XOR of the CRC with the control channel identification number. Clearly, if a first control channel identification number attempts to decode a second control channel identification number, it will unmask the CRC wrongly, and will therefore see CRC failure, as desired.

Some extensions and modifications to the above process are desired in the art to support, for example, the case where CRC length might be different from the control channel identification number length. Embodiments of this disclosure provide such modifications. The modifications provided are two-fold. First, alternate placements of the scrambling or masking process are presented. Second, modifications to the scrambling or masking given the UE identification number are also presented.

Figure 5A:
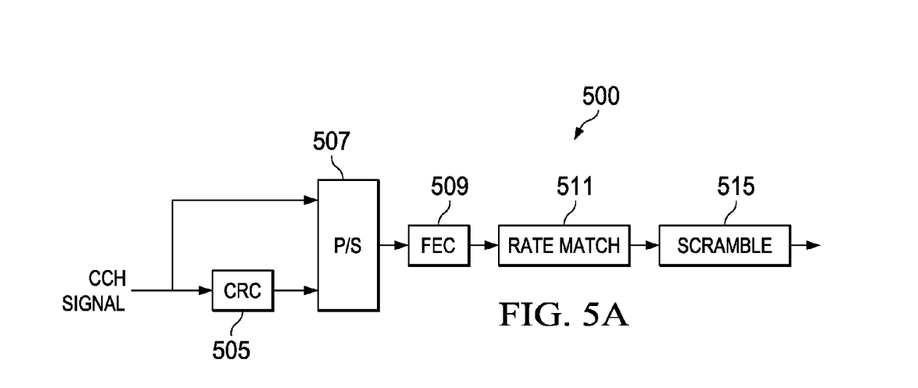
FIGS. 5A, 5B and 5C illustrate alternate embodiments of the control channel transmitter, corresponding to different placements of the scrambling module.
Figure 5B:
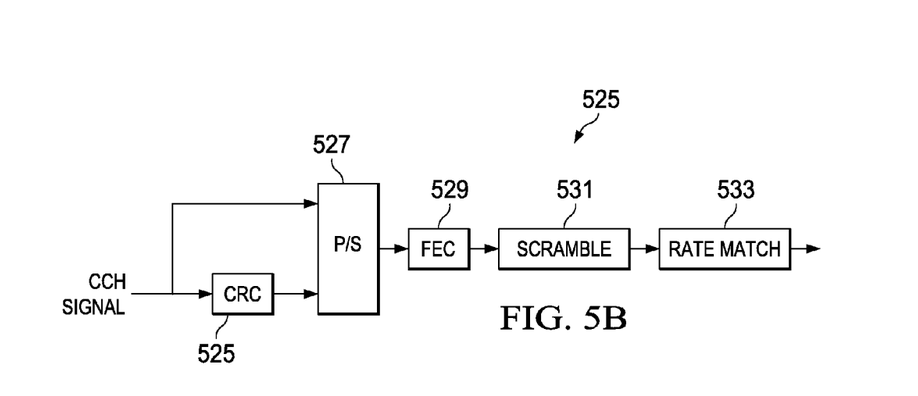
Figure 5C:
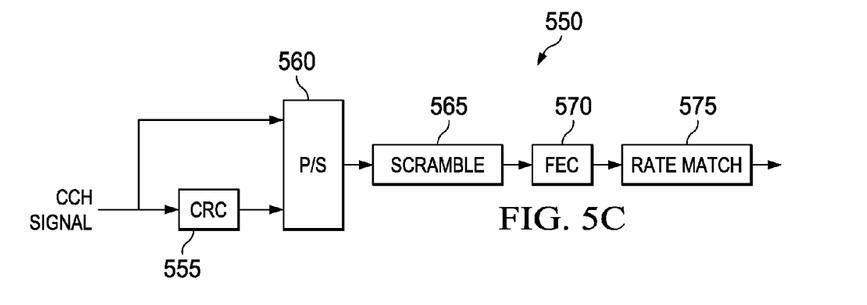

FIGS. 5A, 5B and 5C illustrate alternate embodiments of the control channel transmitter, corresponding to different placements of the scrambling module. As mentioned earlier, the current art uses a structure shown in FIG. 5C, where the scrambling module (565) is placed after padding insertion (560) before FEC encoding (570).

One alternative placement is shown in FIG. 5A, where the scrambling module (515) is placed at the output of FEC encoding (509) and rate matching (511) modules. Yet another alternative embodiment, as shown in FIG. 5B, places the scrambling module (531) at the output of the FEC module (529) before rate-matching (533).

Irrespective of where the scrambling module is placed, the masking sequence needs to be derived, based on the control channel identification number. As described earlier, one embodiment is to make the masking sequence equal to the control channel identification number. However, in cases where the desired length of the scrambler sequence is larger than the control channel identification number, extensions are necessary.

Figure 6A:
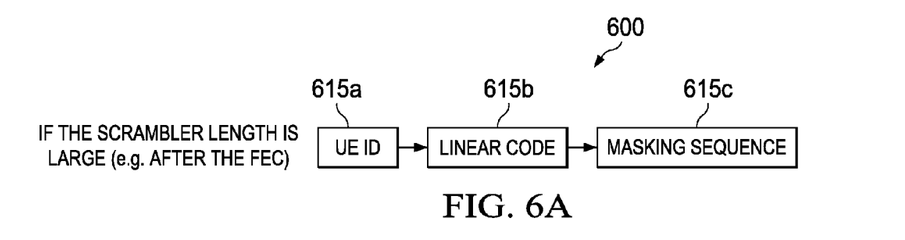
FIGS. 6A, 6B and 6C illustrate embodiments of various exemplary methods to derive the masking sequence from the UE identification number.
Figure 6B:
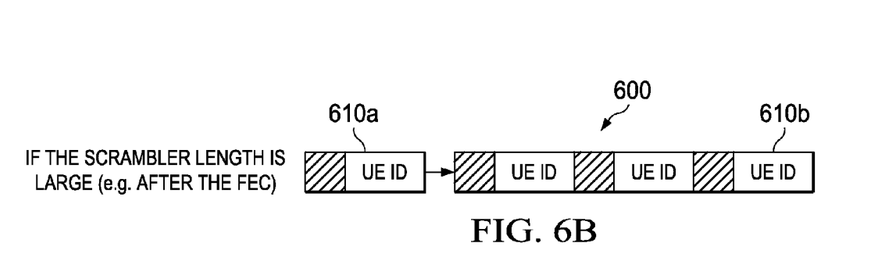
Figure 6C:
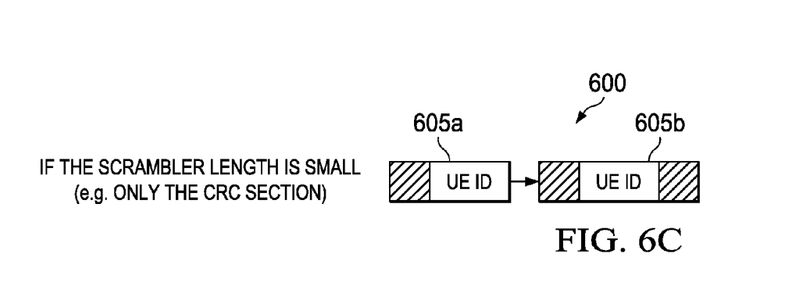

FIGS. 6A, 6B and 6C illustrate embodiments of various exemplary methods to derive the masking sequence from the UE identification number. In the general embodiment shown in FIG. 6A, the control channel identification number (designated as UE ID in 615a) is operated on by a linear code (615b), which adds the desired number of pad bits to obtain a masking sequence (615c) of the desired length. In the specific embodiment illustrated in FIG. 6C, the padding bits are obtained by repeating some of the bits in the UE ID (605a) to yield the masking sequence (605b). In yet another embodiment shown in FIG. 6B, the padding bits are obtained by repeating some of the bits of the UE ID (610a) multiple times to obtain (610b).

In other embodiments, the US identification number is used to determine the update polynomial or seed of a shift register whose output sequence is used for scrambling or masking. Different exemplary embodiments are possible here, as illustrated in FIGS. 7A, 7B AND 7C.

Figure 7A:
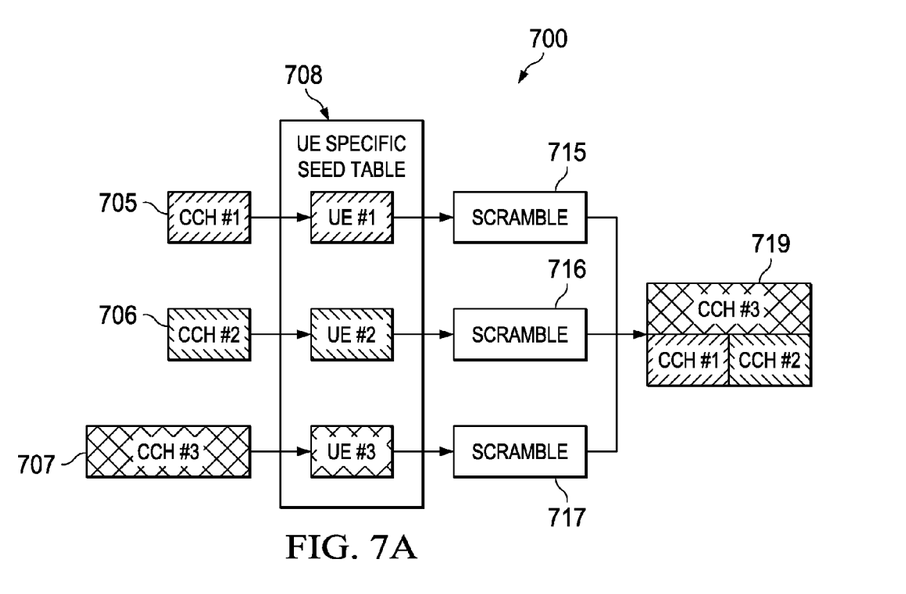
FIGS. 7A, 7B AND 7C illustrate embodiments of shift register seeds or update polynomials employed for scrambling or masking.

In FIG. 7A, the shift register's polynomial is the same for all UEs while only the seed is modified depending on the UE identification number. Thus, the control channel ids (705, 706 and 707) are used to look up a seed from the seed table (708), yielding different seeds for the scramblers 715, 716 and 717 respectively, all of which have the same polynomial. This yields the masking sequences for 719 for the three control channels.

The advantage of this embodiment is the need to use only one scrambler polynomial. The disadvantage is that if two UE ids differ only in a few bits, the corresponding shift register outputs may also not differ only in a few positions, resulting in an increased probability of false CRC passes.

Figure 7B:
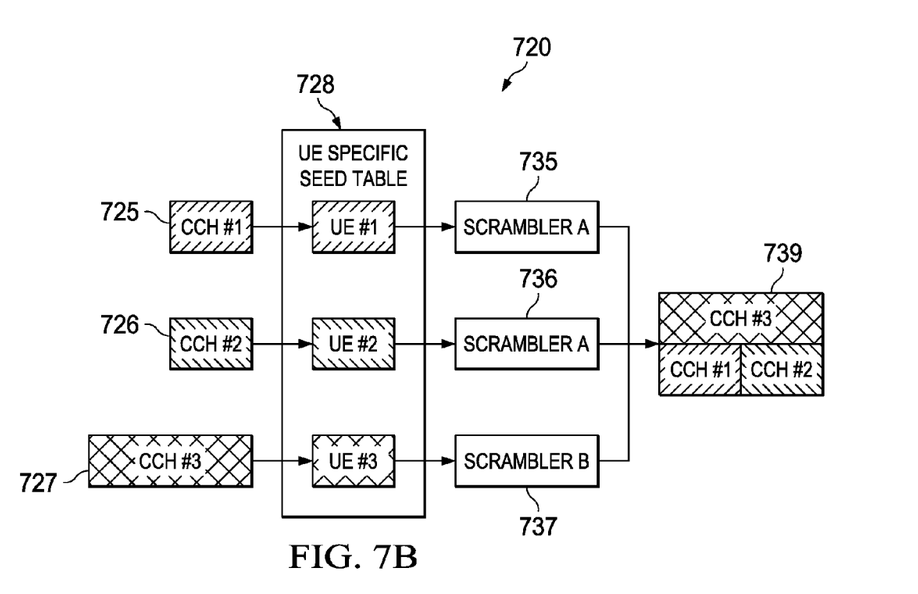
Figure 7C:
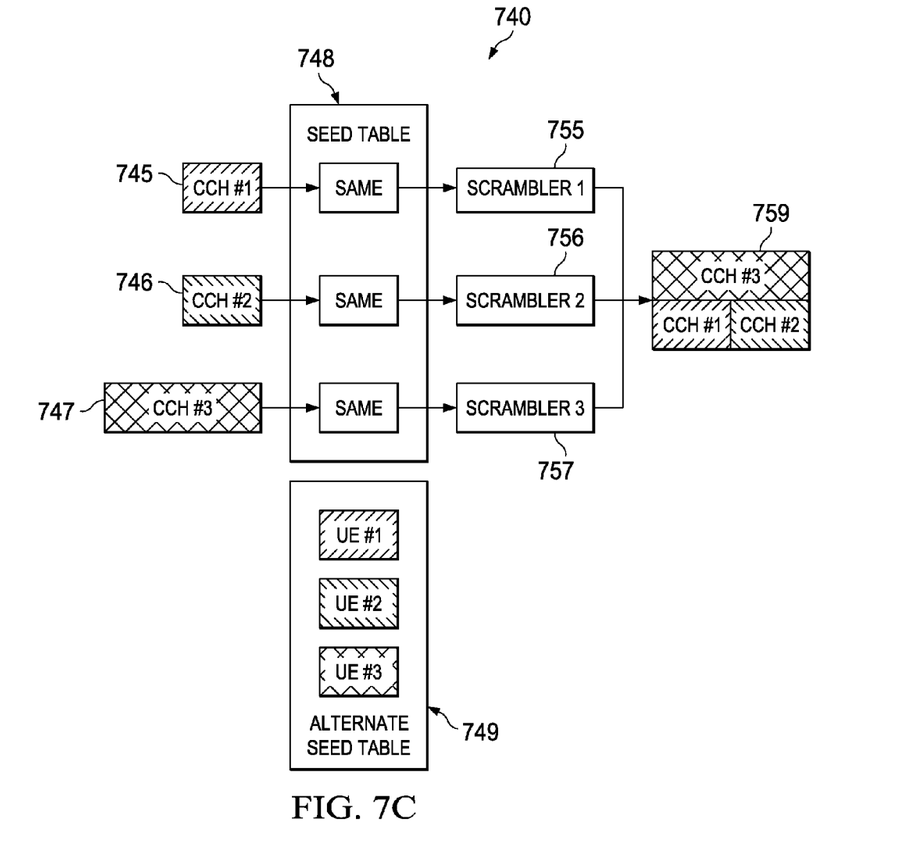

An alternative embodiment is shown in FIG. 7B, wherein the polynomial may depend on the output length of the control channel, while the seed is given by the UE identification number. Thus, similar to FIG. 7A, the control channel identification numbers (725, 726 and 727) are used to look up a seed table (728) yielding seeds for the scramblers 735, 736 and 737. However, since control channel 727 has a different output length from control channels 725 and 726, the corresponding scrambler 737 has a different polynomial from the respectively scramblers 735 and 736 of the latter control channels. These scramblers yield the masking sequences 739 for the control channels shown.

The major advantage of this embodiment is that it also accounts for the output size of the control channel, thus preventing the wrong control channel size to be detected at the UE. This feature is important in cases where information is also conveyed by the size and position of the UE's control channel in the total control signal.

Yet another embodiment is illustrated in FIG. 7C, where the scrambler polynomial also depends on the control channel identification number. Thus, each of the scramblers 755, 756 and 757 corresponding to identification numbers 745, 746 and 747 has a unique scrambler polynomial. In one embodiment, the seed (748) is the same for all three control channel identification numbers. In another embodiment, the seed also depends on the control channel identification number. In this case, the seed table 749 is used to look up the seeds to be used, depending on the control channel identification numbers 745, 746 and 747, respectively.

Figure 8:
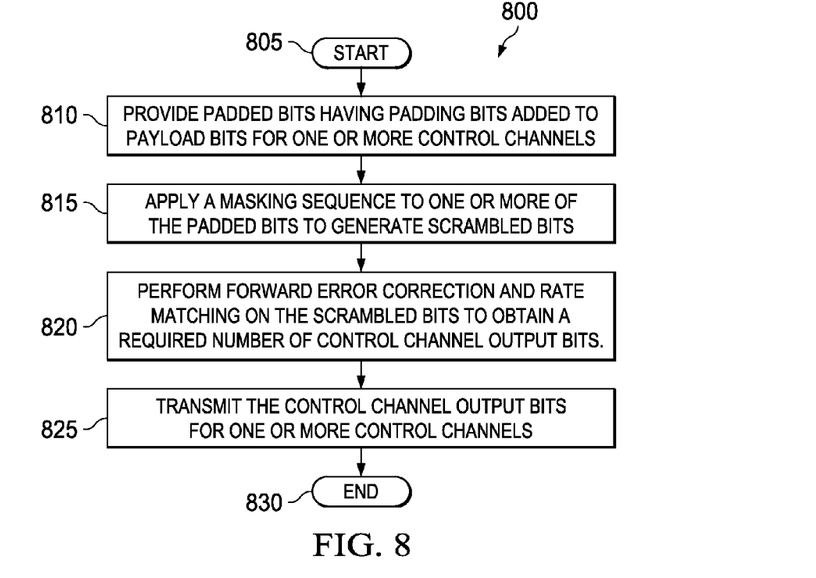
FIG. 8 illustrates a flow diagram of an embodiment of a method of operating a transmitter carried out according to the principles of the present disclosure.

FIG. 8 illustrates a flow diagram of an embodiment of a method of operating a transmitter 800 carried out according to the principles of the present disclosure. The method 800 starts in a step 805, and padded bits having padding bits added to payload bits for one or more control channels are provided in a step 810. In one embodiment the padding bits include cyclic redundancy check (CRC) bits, and a number of CRC bits is adapted depending on the number of payload bits to yield a fixed number of padded bits.

In one embodiment, a portion of the padding bits is obtained by a linear code operating on the payload bits and a remaining portion of the padding bits is obtained by a CRC operating on a combination of the portion of padding bits and the payload bits. Alternatively, a portion of the padding bits is obtained by a CRC operating on the payload bits and a remaining portion of the padding bits is obtained by a linear code operating on the CRC bits. Further, a portion of the padding bits is obtained by a CRC operating on the payload bits and a remaining portion of the padding bits is obtained by a linear code operating on a combination of the payload and CRC bits.

Then, a masking sequence is applied to one or more of the padded bits to generate scrambled bits, in a step 815. In one embodiment, the masking sequence for a control channel is obtained by operating a linear code on an identification number corresponding to the control channel. Alternatively, the masking sequence is obtained by appending one or more padding bits to the identification number, wherein some of the padding bits equal some of the bits of the identification number. Additionally, the masking sequence for a control channel is a function of a combination of an identification number corresponding to the control channel and a length of the control channel output bits.

In one embodiment, the masking sequence for a control channel is an output of a linear shift register having a seed and a shift register polynomial. The seed of the linear shift register for a control channel is obtained by padding an identification number corresponding to the control channel. The shift register polynomial for a control channel is a function of the number of control channel output bits.

Forward error correction encoding and rate matching on the scrambled bits is performed to obtain a required number of control channel output bits in a step 820. The control channel output bits for one or more control channels are transmitted in a step 825, and the method ends in a step 830.

Figure 9:
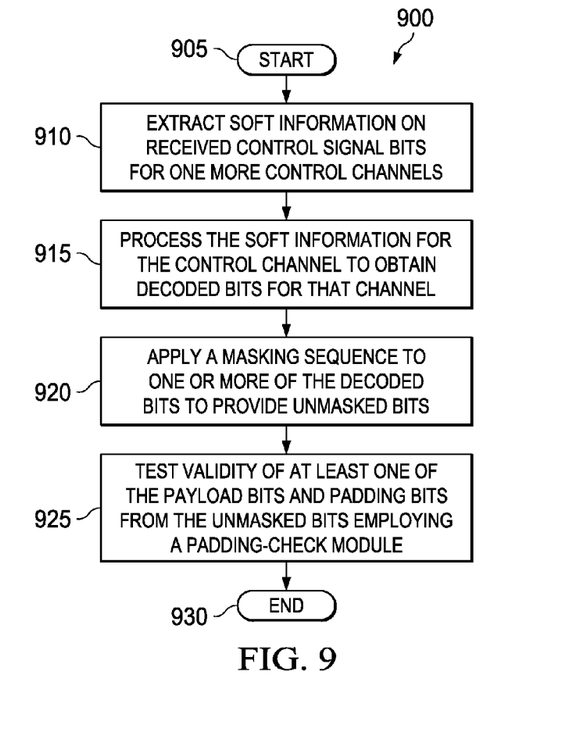
FIG. 9 illustrates a flow diagram of an embodiment of a method of operating a receiver carried out according to the principles of the present disclosure.

FIG. 9 illustrates a flow diagram of an embodiment of a method of operating a receiver 900 carried out according to the principles of the present disclosure. The method 900 starts in a step 905, and soft information on received control signal bits is extracted for one or more control channels in a step 910. The soft information is processed to obtain a set of decoded bits in a step 915.

Then, a masking sequence is applied to one or more of the decoded bits to provide a set of unmasked bits in a step 920. In one embodiment, the masking sequence for a control channel is obtained by a linear code operating on an identification number corresponding to the control channel. Alternatively, the masking sequence is obtained by appending one or more padding bits to the identification number where at least one of the padding bits is derived from the bits of the identification number. Further the masking sequence for a control channel is a function of a combination of an identification number corresponding to the control channel and a length of the control channel output bits.

In one embodiment, the masking sequence for a control channel is an output of a linear shift register having a seed and a shift register polynomial. The seed of the linear shift register for the control channel is obtained by padding an identification number corresponding to the control channel. The shift register polynomial for the control channel is a function of the number of control channel output bits.

Validity of at least one of the payload bits and padding bits from the unmasked bits is tested employing a padding-check module in a step 925. In one embodiment, the padding check module declares validity if the padding bits are equal to a CRC computed on the payload bits. Additionally, the padding-check module tests two or more payload lengths for the same number of unmasked bits corresponding to two or more CRC lengths.

In one embodiment, the padding-check module declares validity if a portion of the padding bits is obtained by a linear code operating on the payload bits and a remaining portion of the padding bits is obtained by a CRC operating on a combination of the portion of padding bits and the payload bits.

In one embodiment, the padding-check module declares validity if a portion of the padding bits is obtained by a CRC operating on the payload bits and a remaining portion of the padding bits is obtained by a linear code operating on the CRC bits.

In one embodiment, the padding-check module declares validity if a portion of the padding bits is obtained by a CRC operating on the payload bits and a remaining portion of the padding bits is obtained by a linear code operating on a combination of the payload and CRC bits. The method 900 ends in a step 930.

While the methods disclosed herein have been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which the disclosure relates will appreciate that other and further additions, deletions, substitutions and modifications may be made to the described example embodiments without departing from the disclosure.

What is claimed is:

1. A receiver comprising:
   a control signal receiving module configured to extract soil information on received control signal bits for one or more control channels;
   a rate de-matching and forward error correction decoding module configured to process the soft information to obtain a set of decoded bits;
   a descrambling module configured to apply a masking sequence to one or more of the decoded bits to provide a set of unmasked bits; and
   a payload extraction and padding-check module configured to test validity of at least one of the payload bits and padding bits from the unmasked bits.

2. The receiver as recited in claim 1 wherein the padding check module declares validity if the padding bits are equal to a CRC computed on the payload bits.

3. The receiver as recited in claim 2 wherein the padding-check module tests two or more payload lengths for the same number of unmasked bits corresponding to two or more CRC lengths.

4. The receiver as recited in claim 1 wherein the padding-check module declares validity if a portion of the padding bits is obtained by a linear code operating on the payload bits and a remaining portion of the padding bits is obtained by a CRC operating on a combination of the portion of padding bits and the payload bits.

5. The receiver as recited in claim 1 wherein the padding-check module declares validity if a portion of the padding bits is obtained by a CRC operating on the payload bits and a remaining portion of the padding bits is obtained by a linear code operating on the CRC bits.

6. The receiver as recited in claim 1 wherein the padding-check module declares validity if a portion of the padding bits is obtained by a CRC operating on the payload bits and a remaining portion of the padding bits is obtained by a linear code operating on a combination of the payload and CRC bits.

7. The receiver as recited in claim 1 wherein the masking sequence for a control channel is obtained by a linear code operating on an identification number corresponding to the control channel.

8. The receiver as recited in claim 7 wherein the masking sequence is obtained by appending one or more padding bits to the identification number where at least one of the padding bits is derived from the bits of the identification number.

9. The receiver as recited in claim 1 wherein the masking sequence for a control channel is a function of a combination of an identification number corresponding to the control channel and a length of the control channel output bits.

10. The receiver as recited in claim 1 wherein the masking sequence for a control channel is an output of a linear shift register having a seed and a shift register polynomial.

11. The receiver as recited in claim 10 wherein the seed of the linear shift register for the control channel is obtained by padding an identification number corresponding to the control channel.

12. The receiver as recited in claim 10 wherein the shift register polynomial for the control channel is a function of the number of control channel output bits.

13. A method of operating a receiver comprising:
    extracting soft information on received control signal bits for one or more control channels;
    processing the soft information for the control channel to obtain a set of decoded bits;
    applying a masking sequence to one or more of the decoded bits to provide a set of unmasked bits; and
    testing validity of at least one of the payload bits and padding bits from the unmasked bits employing a padding-check module.

14. The method as recited in claim 13 wherein the padding check module declares validity if the padding bits are equal to a CRC computed on the payload bits.

15. The method as recited in claim 13 wherein the padding-check module tests two or more payload lengths for the same number of unmasked bits corresponding to two or more CRC lengths.

16. The method as recited in claim 13 wherein the padding-check module declares validity if a portion of the padding bits is obtained by a linear code operating on the payload bits and a remaining portion of the padding bits is obtained by a CRC operating on a combination of the portion of padding bits and the payload bits.

17. The method as recited in claim 13 wherein the padding-check module declares validity if a portion of the padding bits is obtained by a CRC operating on the payload bits and a remaining portion of the padding bits is obtained by a linear code operating on the CRC bits.

18. The method as recited in claim 13 wherein the padding-check module declares validity if a portion of the padding bits is obtained by a CRC operating on the payload bits and a remaining portion of the padding bits is obtained by a linear code operating on a combination of the payload and CRC bits.

19. The method as recited in claim 13 wherein the masking sequence for a control channel is obtained by a linear code operating on an identification number corresponding to the control channel.

20. The method as recited in claim 19 wherein the masking sequence is obtained by appending one or more padding bits to the identification number where at least one of the padding bits is derived from the bits of the identification number.

21. The method as recited in claim 13 wherein the masking sequence for a control channel is a function of a combination of an identification number corresponding to the control channel and a length of the control channel output bits.

22. The method as recited in claim 13 wherein the masking sequence for a control channel is an output of a linear shift register having a seed and a shift register polynomial.

23. The method as recited in claim 22 wherein the seed of the linear shift register for the control channel is obtained by padding an identification number corresponding to the control channel.

24. The method as recited in claim 22 wherein the shift register polynomial for the control channel is a function of the number of control channel output bits.

* * * * *

UNITED STATES PATENT AND TRADEMARK OFFICE
CERTIFICATE OF CORRECTION

PATENT NO.      : 9,143,167 B2  
APPLICATION NO. : 14/194430  
DATED           : September 22, 2015  
INVENTOR(S)     : Badri N. Varadarajan et al.

It is certified that error appears in the above-identified patent and that said Letters Patent is hereby corrected as shown below:

IN THE CLAIMS

Accordingly, Column 9 Line 36 please correct Claim 1 as follows:

Claim 1, line 2, "soil" should be changed to --soft--.

Signed and Sealed this
Twenty-sixth Day of January, 2016

Michelle K. Lee
*Director of the United States Patent and Trademark Office*